United States Patent [19]

Fortune et al.

[11] Patent Number: 5,450,615
[45] Date of Patent: Sep. 12, 1995

[54] PREDICTION OF INDOOR ELECTROMAGNETIC WAVE PROPAGATION FOR WIRELESS INDOOR SYSTEMS

[75] Inventors: Steven J. Fortune, Summit; David M. Gay, New Providence; Brian W. Kernighan, Berkeley Heights; Orlando Landron, Shrewsbury Township, Monmouth County; Reinaldo A. Valenzuela, Holmdel; Margaret H. Wright, Berkeley Heights, all of N.J.

[73] Assignee: AT&T Corp., Murray Hill, N.J.

[21] Appl. No.: 172,009

[22] Filed: Dec. 22, 1993

[51] Int. Cl.$^6$ .............................................. H04B 17/00
[52] U.S. Cl. .................................. 455/67.6; 455/52.1; 364/550
[58] Field of Search ..................... 455/67.1, 67.2, 67.6, 455/41, 54.1, 56.1, 52.1; 264/550; 379/55; 324/96

[56] References Cited

U.S. PATENT DOCUMENTS

| 4,941,207 | 7/1990 | Maeda et al. | 455/41 X |
| 5,301,127 | 4/1994 | Hitney | 456/40 |
| 5,327,359 | 7/1994 | Hitney | 364/550 |

OTHER PUBLICATIONS

George, "A Study of UHF Wideband Propagation Char.", Institute of Radio Engineers, vol. 27, No. 1, Jan. 1939.

Peterson, "UHF Propagation Formulas", RCA Review, Oct. 1939.

*Primary Examiner*—Edward F. Urban
*Attorney, Agent, or Firm*—Steven R. Bartholomew

[57] ABSTRACT

Techniques are disclosed for predicting RF propagation within a structure such as a building. A reference transmitter location and a plurality of reference receiver locations are selected. For each reference receiver location, RF propagation pathways are determined with respect to the reference transmitter location. The RF propagation pathways include a direct path joining the reference transmitter location to a given reference receiver location across a straight-line path, as well as one or more reflection paths joining the reference transmitter location to a given reference receiver location via reflections from one or more reflective surfaces. One or more propagation pathways may pass through an RF obstacle, such as, for example, a lossy dielectric material. Each reflective surface and RF obstacle is associated with a reflection coefficient and a transmission coefficient. These coefficients are computed for each object and surface from a multilayer dielectric model, maintaining angle and polarization dependencies. For each propagation pathway, a propagation component consisting of the propagation loss relative to free-space propagation is calculated as the product of the magnitude squared of the reflection and transmission coefficients. The local mean of received RF power at each of the reference receiver locations is calculated as the scalar sum of the powers of all the propagation pathway components reaching the specified location.

2 Claims, 5 Drawing Sheets

PREDICTION OF INDOOR ELECTROMAGNETIC WAVE PROPAGATION FOR WIRELESS INDOOR SYSTEMS

TECHNICAL FIELD

This invention relates generally to systems and methods for predicting the propagation of electromagnetic waves, and more specifically to techniques for expeditiously predicting the indoor coverage area of wireless transmission systems using ray tracing approaches.

BACKGROUND OF THE INVENTION

A wide variety of wireless indoor communication systems are enjoying increased popularity in industrial, commercial, and residential environments. These communication systems include, for example, cordless, wireless, and cellular telephones, paging systems, two-way radio services, video conferencing systems, and others. Quite frequently, the overall effectiveness of a given system is determined by the performance and reliability of one or more RF communications links. Whenever possible, it is important to position transmitting and receiving antennas such that solid, reliable communications links are provided throughout the desired operational area of a wireless communications system. For example, wireless systems often employ a number of portable units used in conjunction with one or more base stations. Although portable units may be used throughout the building, the base stations generally remain at fixed locations, thus affording the system designer an opportunity to optimize the position of the base station antenna.

The task of selecting suitable antenna locations is especially challenging in indoor environments. Buildings fabricated in conformance with modern construction practices typically utilize numerous RF-absorbing and/or reflecting materials such as steel-reinforced concrete, metallic partitions, aluminum air ducts, electrical conduit, plumbing, aluminum-clad fiberglass insulation, steel structural members, and others. These materials significantly degrade the performance of indoor RF communications systems. RF signals may be severely attenuated over relatively short distances. Multiple reflections and/or multiple signal pathways set up standing wave patterns which may cause signals to fade in and out as receivers, transmitters, people, and/or objects move or are moved about the building.

One approach to resolving the difficulties inherent in indoor RF propagation is to employ a multiplicity of receivers, transmitters, and/or antennas. A "brute force" approach may also be used, where transmitters are equipped to operate at relatively high RF power levels. However, these approaches serve to increase the cost and complexity of a communications system. Furthermore, the use of high RF power levels is undesirable due to recent public concern over the health effects of electromagnetic radiation.

A better approach to resolving indoor propagation difficulties is to optimize antenna placement for antennas which are to remain at a fixed location within a building. Several techniques may be employed to determine suitable locations for transmitting and/or receiving antennas. The simplest technique is intuitive, and involves placing the antennas (a) in centralized locations, (b) at relatively high elevations, (c) away from nearby conductive objects, and/or (d) such that a relatively obstacle-free path is provided between the antenna and the desired coverage area.

The process of intuitively determining proper antenna placement can be tedious and time-consuming. In practice, these intuitive techniques must often be combined with trial-and-error, cut-and-try methods to arrive at suitable antenna locations. The resonant frequency, standing wave ratio, and efficiency of the antenna are significantly influenced by proximity to nearby objects. Unpredictable nulls and standing-wave patterns can occur throughout the desired operational area. A multiplicity of on-site field strength measurements must generally be taken to assess and to optimize system performance. This procedure is labor-intensive, and may not result in the best practical solution for a given communications system.

It may be possible to reduce the number of antennas and/or transceivers required under the aforementioned "intuitive" approach by using one or more mathematical propagation models. Thus, the intuitive approach may result in a relatively expensive system which includes unnecessary redundancies in terms of antennas and/or transceivers. Likewise, the intuitive approach may not adequately account for all propagation obstacles, resulting in a system having poor coverage in certain areas of the building.

It is theoretically possible to calculate exact RF field strength values throughout the operational area of a communications system. Such a task could be accomplished by solving Maxwell's equations, using the building geometry to provide boundary conditions. Unfortunately, this approach is beyond the computing power of present-day personal computing devices, and is better suited for large mainframe computers. Moreover, the factors affecting RF propagation cannot always be represented with mathematical precision. For example, the electrical and magnetic properties of building materials are subject to field variations. Objects within the building, such as metal desks, bookcases, and filing cabinets, may be relocated from time to time. Propagation is also influenced by the movements of people throughout the structure. Although these building materials and objects can be characterized through actual measurements, such a task would prove very time-consuming.

Due to the significant complexities involved in performing exact RF propagation calculations, various techniques for estimating or predicting RF field strength have been developed. Illustrative examples of propagation models are disclosed in "Ray tracing as a design tool for radio networks", by J. W. McKown and R. L. Hamilton, *IEEE Network Magazine,* Vol. 5, No. 6, pp. 27–30, November 1991, and "Mechanisms governing UHF propagation on single floors in modern office buildings", by W. Honcharenko, H. L. Bertoni, J. Dailing, J. Qian, and H. D. Yee, *IEEE Transactions on Vehicular Technology,* Vol. 41. No. 4, pp. 496–504, November 1992. These RF propagation models facilitate the calculation of RF field strength values by implementing one or more simplifying assumptions.

Existing mathematical prediction techniques do not provide a practical, efficient approach for designing indoor RF communications systems. These techniques were often developed in academic environments for use with large mainframe computers. Although the prediction of indoor field strength can be implemented with a high degree of accuracy, the required computational time is typically measured in terms of hours or days. Furthermore, the relatively complex mathematical computations are not expeditiously performed by state-of-the-art personal, laptop, or notebook computers. Unreasonable computational time and/or impractically large amounts of computing power would be required to implement these mathematical propagation prediction techniques in the field.

The simplifying assumptions implemented by prior art propagation prediction techniques do not sufficiently enhance computational efficiency for many practical, real-world applications. What is needed is an improved approximation technique for analytically characterizing and optimizing indoor RF communications systems. For these applications, it is not generally necessary to have exact agreement between predicted and measured field strength values. Rather, for the purpose of comparatively evaluating several possible indoor communication system design alternatives, it is more important to characterize average field strength values at locations throughout the desired service area.

SUMMARY OF THE INVENTION

Techniques are disclosed for predicting RF propagation within a structure such as a building. The structure includes a plurality of RF reflective surfaces. A reference transmitter location and a plurality of reference receiver locations are selected. For each reference receiver location, RF propagation pathways are determined with respect to the reference transmitter location. The RF propagation pathways include a direct path joining the reference transmitter location to a given reference receiver location across a straight-line path, as well as one or more reflection paths joining the reference transmitter location to a given reference receiver location via reflections from one or more reflective surfaces. Reflection paths up to any arbitrary number of reflections are considered. One or more propagation pathways may pass through an RF obstacle, such as, for example, a lossy dielectric material. Each reflective surface and RF obstacle is associated with a reflection coefficient and a transmission coefficient. The reflection coefficient specifies the ratio of reflected to incident RF. The transmission coefficient specifies the ratio of RF transmitted through the obstacle or surface to the RF incident upon the obstacle or surface. These coefficients are computed for each object and surface from a multilayer dielectric model, maintaining angle and polarization dependencies. For each propagation pathway, a propagation component consisting of the propagation loss relative to free-space propagation is calculated as the product of the magnitude squared of the reflection and transmission coefficients. The local mean of received RF power at each of the reference receiver locations is calculated as the scalar sum of the powers of all the propagation pathway components reaching the specified location. It is understood that the terms "reference transmitter location" and "reference receiver location" are used for analytical purposes to determine propagation path loss. Since propagation path loss is reciprocal, it is possible to exchange the roles of the reference locations to predict path loss, and/or to use transceivers at one or more of the reference locations after propagation path loss has been predicted.

DETAILED DESCRIPTION OF THE PREFERRED EMBODIMENTS

Figure 1:
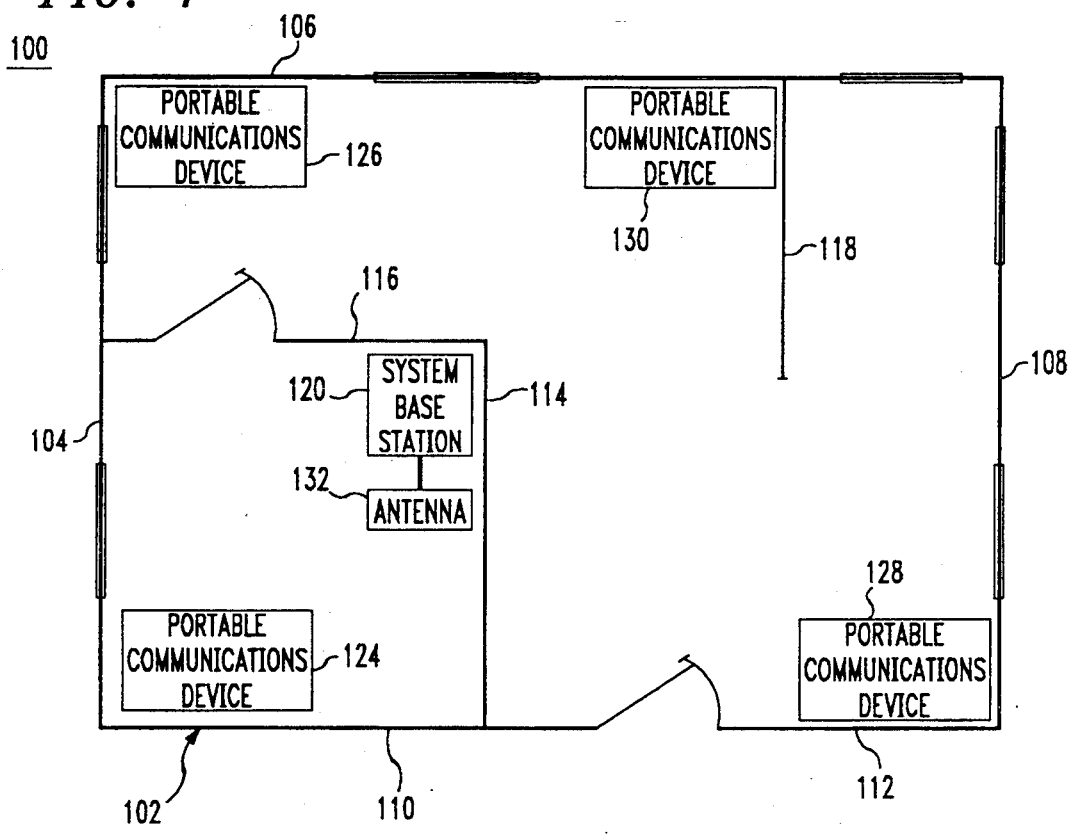
FIG. 1 is a plan view illustrating the operational environment of a wireless communications system to which the techniques of the present invention may be applied.

The techniques of the present invention were developed to enhance the performance of wireless communications systems. Referring to FIG. 1, an illustrative example of an indoor wireless communications system 100 is shown. The communications system 100 operates within the confines of a building 102 containing a plurality of walls or partitions 104, 106, 108, 110, 112, 114, 116, 118. The building 102 may include steel structural members, steel-reinforced concrete, metallic partitions, non-metallic partitions, plumbing, electrical conduit, sheet-metal air ducts, aluminum-backed fiberglass insulation, metallic doors, furniture, and other objects. A system base station 120 operates from a fixed location. Although only one base station 120 is shown in FIG. 1 for the sake of brevity, it is understood that communications system 100 could include a plurality of system base stations. A plurality of portable communications devices 124, 126, 128, 130 may be utilized throughout the building 102, and are each equipped to communicate with the base station 120 over an RF communications link.

Base station 120 is equipped with an antenna 132. It is desired to position the antenna 132 at a location which provides optimum RF coverage within the building 102, such that, when the antenna 132 transmits a signal, the received RF power at virtually all locations within the building 102 exceeds a predetermined value. In this manner, the communications system 100 will provide reliable RF communication links throughout the entire building, whereas nulls and weak-signal areas will be minimized or nonexistent.

Figure 2:
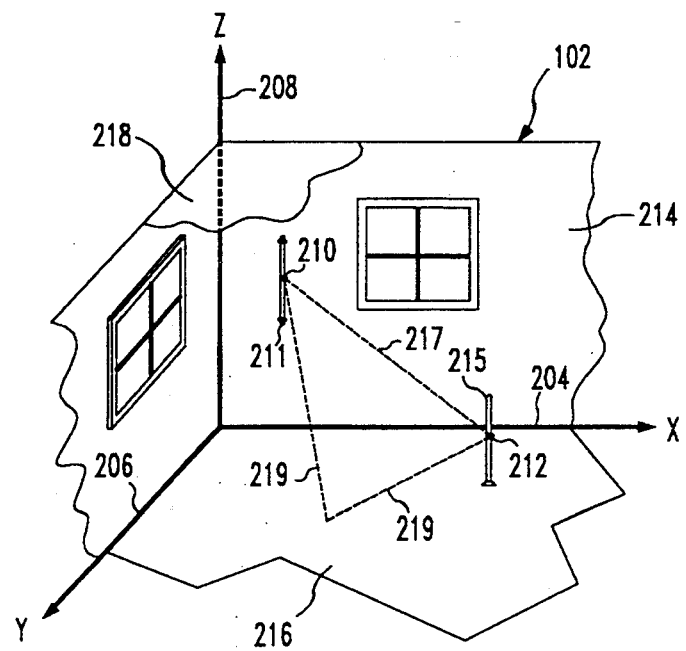
FIG. 2 is a perspective view illustrating direct and reflected waves in the operational environment of a wireless communications system.

Referring now to FIG. 2, techniques for predicting RF received power levels will be described. First, a three-dimensional coordinate system is defined for the structure or building 102. For example, the x axis 204 may be oriented horizontally along a first face of the building, the y axis 206 oriented horizontally along a second face, and the z axis 208 oriented vertically. A transmitter point 210 and one or more receiver points 212 are specified, for example, in (x,y,z) coordinate form. A transmit antenna 211 is positioned at the transmitter point 210, and a receive antenna 215 is positioned at the receiver point 212. The transmit antenna 211 is fed with a referenced amount of RF power. Each surface, such as wall 214, floor 216, and ceiling 218, is modeled as a multilayer dielectric. The transmission and reflection coefficients for both horizontal and vertical polarizations are computed for each surface using a recursive analysis approach. Recursive analysis is a technique well known to those skilled in the art, and it is described in the textbook "Fields and Waves in Communications Electronics" by S. Ramo, J. R. Whinnery, and T. Van Duzer, published by John Wiley & Sons, 1967.

In applying the recursive analysis approach, simplifying assumptions may be made to enhance computational efficiency, while at the same time providing results of sufficient accuracy for most practical communication system design problems. For example, both transmit and receive antennas 211, 215 are assumed to be vertical half-wave dipoles. It is assumed that each surface provides substantially specular reflections. This assumption is valid for approximately smooth surfaces such as walls. Furthermore, all surfaces are assumed to be orthogonal, in the sense that these surfaces are conceptualized as being situated in a plane formed by lines parallel to any of two axes including the x, y, and z axes. This assumption is valid for many buildings in existence today. However, if a given building contains curved, diagonal, irregular, and/or arbitrarily-angled surfaces, these surfaces can be represented using more complex mathematical expressions at the expense of computational efficiency.

For each surface, the reflection coefficients and transmission coefficients are sampled using the recursive prediction techniques described above. The transmit and receive antenna patterns are sampled as well, using standard field-strength calculations well known to those skilled in the art and described, for example, in the above-cited Ramo textbook. Sampling is conducted with a resolution of ten samples per degree and the sampled values are stored, for example, in look-up tables.

The propagation prediction process begins with the calculation of a received power value for a direct path 217 from transmitter point 210 to receiver point 212. This direct path 217 is the straight-line path from the transmitter point 210 to the receiver point 212, which may or may not pass through a surface such as a wall, but which does not include reflections from surfaces. The direct path received power values are calculated using a standard free-space propagation formula, where free-space loss is conceptualized as being a function of the total path length. These free-space propagation formulas are known to those skilled in the art and are set forth, for example, in the Ramo reference. In addition to free-space losses, transmission losses must also be considered. Transmission losses result when the propagation path passes through an obstruction such as a surface. This transmission loss is determined and normalized in accordance with the recursive procedures set forth above and described in greater detail in the aforementioned Ramo textbook. For example, if the direct path does not include any obstacles, the normalized transmission loss is 1, whereas if an obstacle completely blocks an RF signal, the normalized transmission loss is 0. The total propagation loss for the direct path is calculated as the product of the free-space loss and the normalized transmission losses. The power received at the receiver point 212 from the direct path may be determined from the total direct path propagation loss. These calculations are well known to those skilled in the art, and are performed using conventional methods such as those set forth in the Ramo reference.

Next, received power for all one-reflection paths 219 are calculated, followed by all paths involving two reflections. One-reflection paths 219 involve one reflection from one surface, whereas two-reflection paths involve a first reflection from a first surface followed by a second reflection from a second surface. This received power calculation process may be repeated to encompass any desired number of reflections. However, high-order reflections may have a minor impact on the total power received at the receiver point 212, relative to lower-order reflections. Furthermore, the number of possible high-order paths can be considerably higher than the number of lower-order paths, resulting in lower computational efficiencies with no useful improvement in accuracy.

The received power values for the reflection paths are calculated using the free-space propagation formula set forth above. In addition to the free-space loss, however, reflection and transmission losses must also be considered. Reflection losses result from the reflection of electromagnetic energy incident upon a surface. These losses may be normalized such that a reflection loss of 1 signifies a perfect reflection where all of the incident electromagnetic energy is reflected from the surface. A normalized reflection coefficient of 0 signifies that none of the electromagnetic energy incident upon the surface is reflected. Reflection losses are determined in accordance with the recursive procedure described above and set forth in greater detail in the Ramo reference. Transmission losses on the reflection path must be considered if the reflection path passes through any obstacles. These transmission losses were described above in connection with direct path losses.

The total path loss for a given reflection path is computed as the product of the free-space loss, the normalized reflection loss, and any normalized transmission loss. After the total path loss for a given reflection path has been determined, it is possible to calculate the power received at the receiver point from this reflection path. This calculation is performed using methods well known to those skilled in the art and disclosed in the Ramo reference. Once the losses for all reflection pathways up to a specified number of reflections have been calculated, the total received power at the receiver point 212 is calculated as the scalar sum of the received power values for the direct path and the reflection paths considered above. Note that reflection path losses and direct path losses can be scaled for different types of antennas simply by multiplying the total calculated path loss by the antenna power gain in the direction of interest.

It is to be understood that the concepts of the transmitter point and the receiver point are employed for analytical purposes to determine propagation path loss. Since propagation path loss is reciprocal, it is possible to exchange the roles of these points, such that the transmitter point becomes the receiver point and the receiver point becomes the transmitter point. Furthermore, it is to be understood that, in practice, an indoor wireless system may employ both transmitters and receivers at the receiver point location, and both transmitters and receivers may be used at the transmitter point. Alternatively, a transmitter may be used at the receiver point, and a receiver at the transmitter point. For example, the transmitter point selected for purposes of propagation prediction is typically the proposed location of a system base station which includes a transceiver, whereas the receiver point is selected in the general location where portable units are to be employed. These portable units may contain transceivers.

In computing the reflection path losses, a novel imaging technique is utilized. Starting at the receiver point 212, the propagation path is traced backwards, in a direction opposite to the direction of travel of the RF energy. Once the tracing process encounters a first reflective surface, the location of the receiver point 212 image is determined relative to the first reflective surface. This receiver antenna image location is conceptualized as the first order image location of the receiver antenna, and the propagation path is traced backwards from the first reflective surface until a second reflective surface is encountered. The image location of the first order image about the second reflective surface is determined, and may be conceptualized as the second order image location. This process is recursively repeated until no new reflective surfaces are encountered. It is then possible to calculate the overall path length of the reflection path by referring to the distance between the transmitter point 210 and the highest-order image location.

Figure 3:
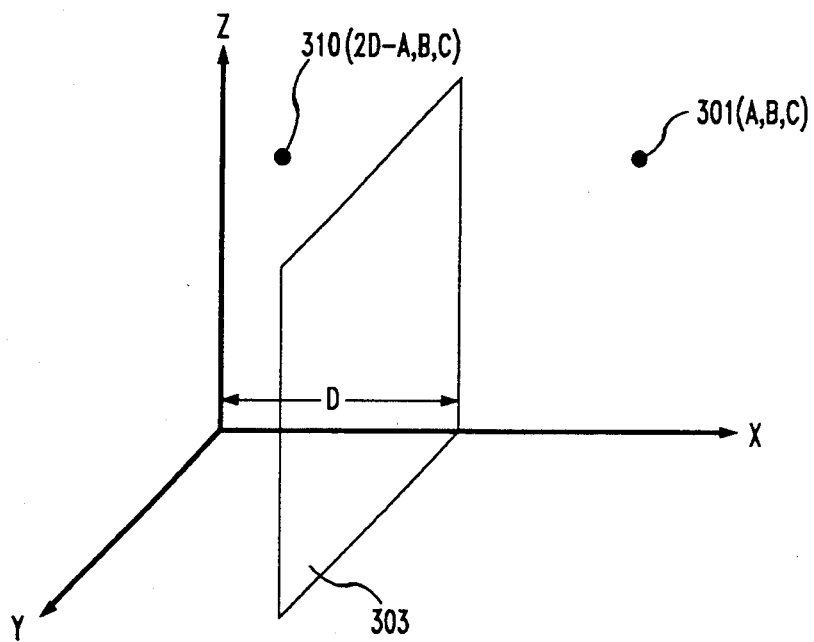
FIG. 3 is a three-dimensional graph illustrating the concept of an image about a plane.

The coordinates for the image of a point (i.e., the receiver point 212) reflecting over a surface are found by reflecting the coordinate corresponding to the axis parallel to the surface normal. For example, refer to FIG. 3 which shows a point 301 having coordinates (a, b, c). A reflecting surface 303 is situated parallel to the yz plane and located at a distance D along the x axis. The image 310 of point 301 has coordinates (2D-a, b, c). In this manner, the coordinates of the highest order image of the receiver point 212, for an arbitrary path involving multiple reflections, are found by successively reflecting the receiver point 212 coordinates over the sequence of reflecting surfaces defining the path under consideration.

An arbitrary reflection path may be uniquely specified simply by setting forth the sequence of surfaces reflecting the incident RF energy traveling from the transmitter point 210 to the receiver point 212 along the reflection path. For example, assume that there are four surfaces designated as surface 1, surface 2, surface 3, and surface 4. Reflection path 3-4-2 specifies a path from the transmitter point 210 to surface 3, surface 4, surface 2, and then to the receiver point 212.

Figure 4:
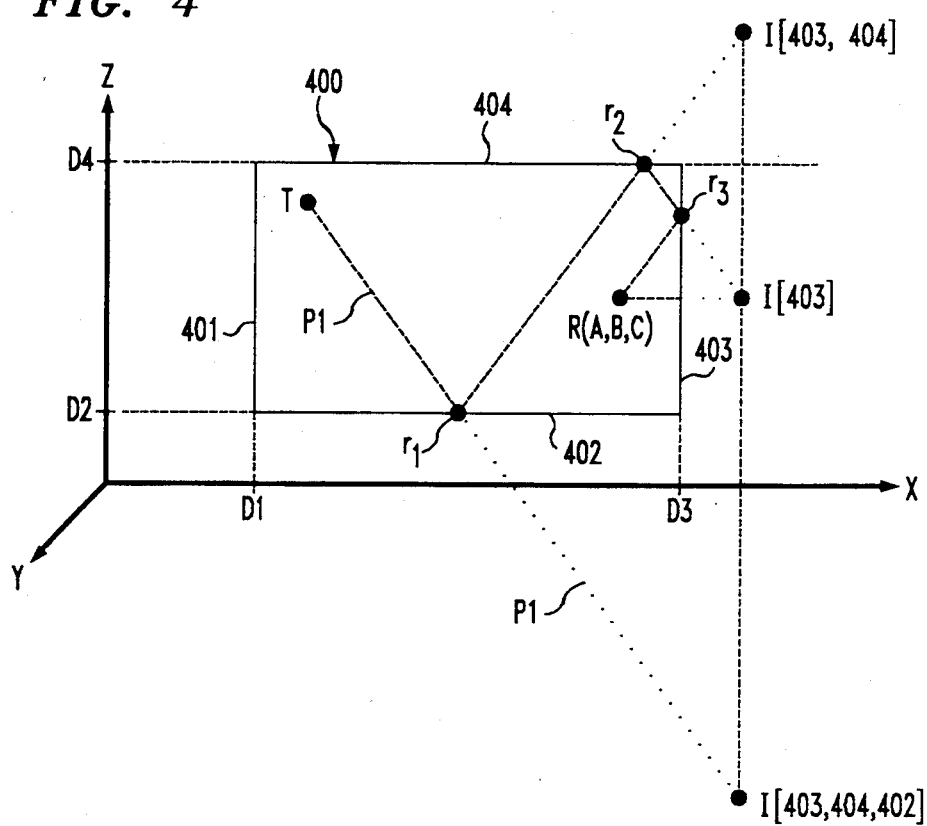
FIG. 4 is a diagram illustrating the technique of image tracing according to a preferred embodiment of the present invention.

Once the coordinates for the highest order image of the receiver point 212 have been determined, the overall reflection path length is computed as the length of the line joining this image to the receiver point 212. For example, consider a rectangular room 400 shown in FIG. 4. The room includes a first wall 401 and a second wall 403. The first wall 401 and the second wall 403 are both parallel to the yz plane. First wall 401 is located at a point D1 along the x axis, and second wall 403 is located at a point D3 along the x axis. A third wall 402 and a fourth wall 404 are parallel to the xz plane, and are located at points D2 and D4, respectively, along the y axis. A transmitting antenna is located at point T, and a receiving antenna is located at point R having coordinates (a,b,c).

Assume that it is desired to determine the path loss for reflection path 402-404-403. In order to trace this reflection path backwards from R to walls 403, 404, and 402 to T, three images must be determined. First, I[403], the first order image of the receiver antenna point R about second wall 403 is calculated. This first order image represents the one-reflection image of the receiver antenna point R over second wall 403. This image is calculated by reflecting the receiver antenna point R coordinates (a, b, c) over the second wall 403. Thus, I[403], the first order image, has coordinates ((2*(D3)-a), b, c). Next, the second order image, I[403,404], is found by reflecting the first order image over the semi-infinite plane containing wall 404, yielding second order image coordinates of ((2*(D3)-a), (2*(D4)-b), c). Finally, the third order image, I[403,404,402], is determined. Note that, as with wall 404, wall 402 is also normal to the y axis. Thus, the coordinates of the highest order image are calculated by reflecting the y-coordinate again, yielding coordinates ((2*(D3)-a), ((2*(D2))-((2*(D4))-b)), c).

Once the highest order image is calculated, the actual reflection path is represented by image path P1. P1 is formed by joining T with I[403, 404, 402] along a straight-line path. In this manner, the total length of the actual reflection path is equal to the length of image path P1. This image path serves to significantly reduce the mathematical complexities involved in calculating propagation path losses for actual reflection paths. Furthermore, the coordinates of reflection points r1, r2, and r3 are known.

The distances between T and r1, r1 and r2, r2, and r3, and r3 and R are projected along the straight-line image path so that propagation losses occurring at reflection points r1, r2, and r3 can be applied to the appropriate locations on image path P1 to simplify the calculation of propagation path losses. These reflection points r1, r2, and r3 are determined as follows. The first reflection point, r1, is the point where the line connecting points T and I[403,404,402] intersects with wall 402. The second reflection point, r2, is the point where the line connecting r1 and I[403,404] intersects with wall 404. Similarly, r3 is the point where the line connecting r2 and I[403] intersects with wall 403. Finally, the path 403-404-402 is completed with the segment r3-R. At each reflection point, values for the transmission coefficient and the reflection coefficient are determined, based upon the nature and composition of the reflecting material. These values may be obtained via direct measurements and/or via analytical calculations if the physical properties of the reflecting materials are known. These analytical calculations are known to those skilled in the art and are disclosed, for example, in the Ramo textbook cited above. From these measurements and/or calculations, a table of reflection and transmission coefficients can be prepared for various materials.

Although an image tracing process has been described which commences tracing at the receiver point, it is to be understood that the process could alternatively commence at the transmitter point. Due to the fact that propagation path losses are reciprocal, the ray tracing process may be commenced at either the receiver point or the transmitter point. If the transmitter point is selected as the starting point, the term "receiver point" in the above discussion is replaced with the term "transmitter point," and the term "transmitter point" is replaced with "receiver point." Regardless of which point is selected as the starting point, the path loss prediction will be identical.

Once the reflection paths have been characterized as set forth in the immediately preceding paragraphs, the reflection path loss and path time delay can be determined using conventional methods known to those skilled in the art. These methods are set forth, for example, in the aforementioned Ramo textbook.

Figure 5:
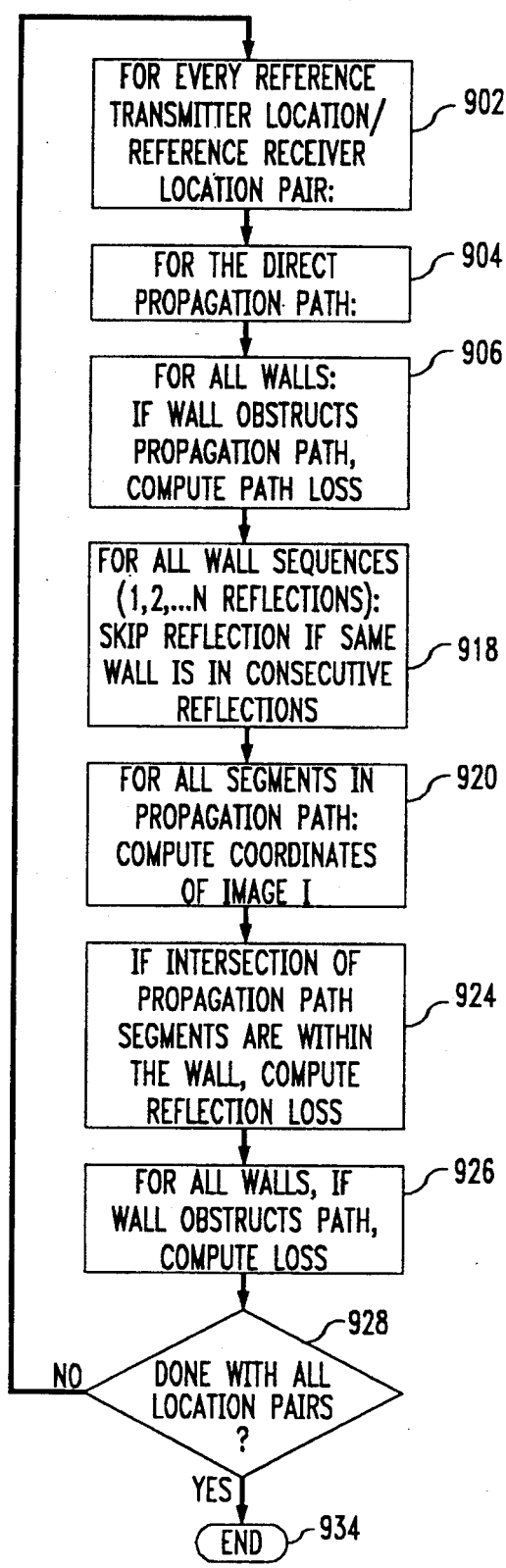
FIG. 5 is a flowchart setting forth a method for predicting RF propagation by ray-tracing.

FIG. 5 is a flowchart setting forth a method for predicting RF propagation by ray-tracing, using the method of images described above in connection with FIGS. 3–4. The method is implemented, starting at block 902, for every reference transmitter location/reference receiver location pair. For each of these location pairs, the method is implemented for direct propagation paths (block 904). For all walls, if the wall obstructs the propagation path, the path loss is computed at block 906. Next, for all wall sequences representing (1, 2, . . . N) reflections, wall sequences involving the same wall in consecutive reflections are eliminated from further consideration (block 918). At block 920, for all segments in the propagation path, the coordinates of the image point (denoted by I[n . . .]) are computed. If the intersection of propagation path segments are within a wall, reflection loss is computed (block 924). For all walls, if the wall obstructs a path, the path loss is computed (block 926). Finally, the program checks to see whether all transmitter/receiver reference location pairs have been analyzed (block 928) If so, program control transfers back to block 902. However, if all location pairs have been considered, the program terminates (block 934).

Figure 6:
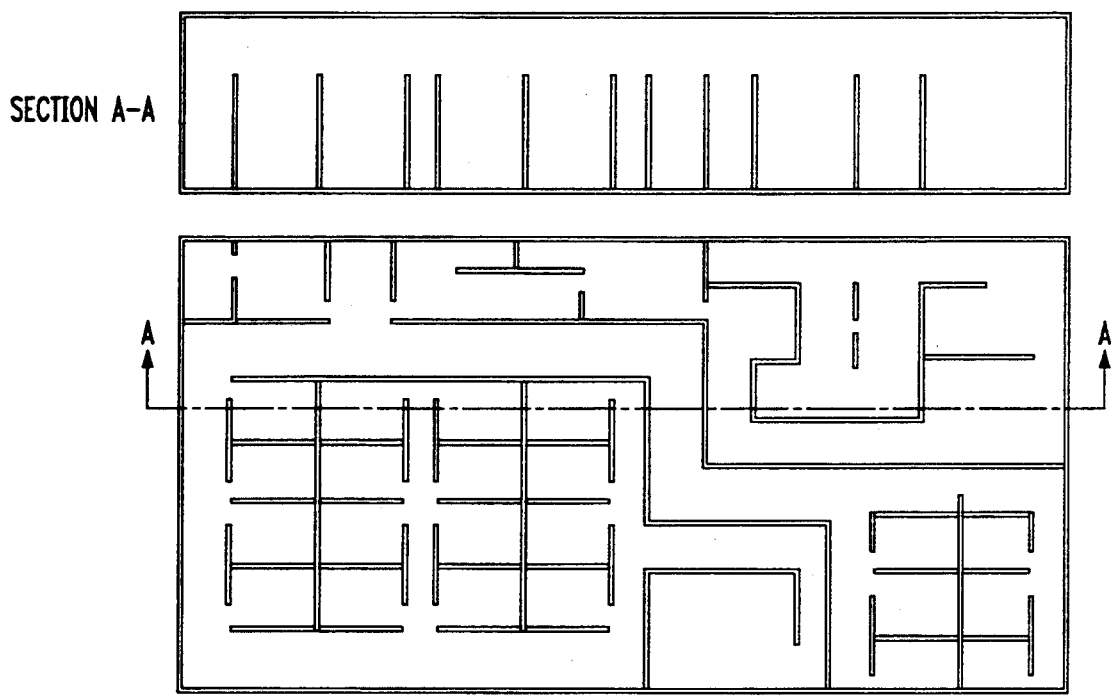
FIG. 6 is a plan view showing a structure for which the techniques of the present invention may be utilized to optimize wireless communications therein.

The propagation prediction techniques disclosed herein have been assessed by comparison with actual received power measurements. Measurements were conducted in the test building illustrated in FIG. 6. FIG. 6 depicts a plan view of a building in a horizontal plane. A cross-sectional view in a vertical plane along section a–a' is also shown. FIG. 6 reveals that the internal partition walls of the building do not extend all the way to the true ceiling due to the presence of a "false" or suspended ceiling. Such ceiling structures are widely utilized in modern-day office buildings. The suspended ceiling is considered to be transparent to RF over the frequency ranges of interest.

All measurements were conducted at 2 gHz with half-wave dipole antennas each having a center of radiation 3 meters above the floor of the building. Received power data were recorded at 1000 individual measurement points while moving the receiving antenna over a circular area of a few wavelengths in diameter. For each measurement point, the local, average, maximum, and minimum received power values were recorded. All measurement sessions began and ended with a calibration measurement of the received power at 1 meter. A 100 watt RF power amplifier was utilized to yield an average received power at 1 meter of −21 dBm. This value was substantially independent of the specific location of the equipment within the building.

Figure 7:
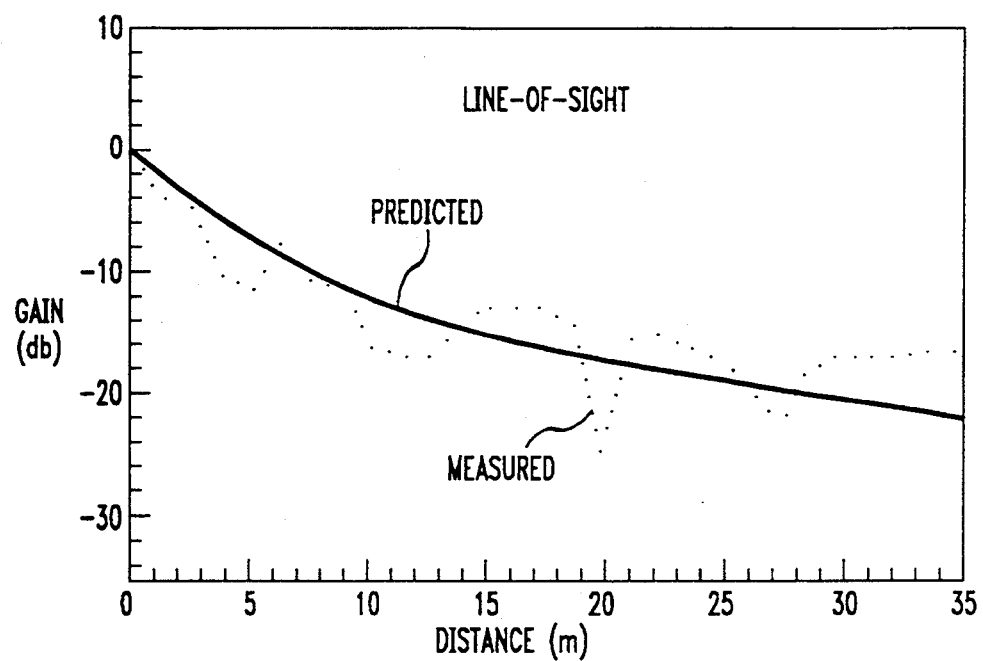
FIG. 7 is a graph showing both predicted and measured propagation loss versus distance over unobstructed line-of-sight pathways.
Figure 8:
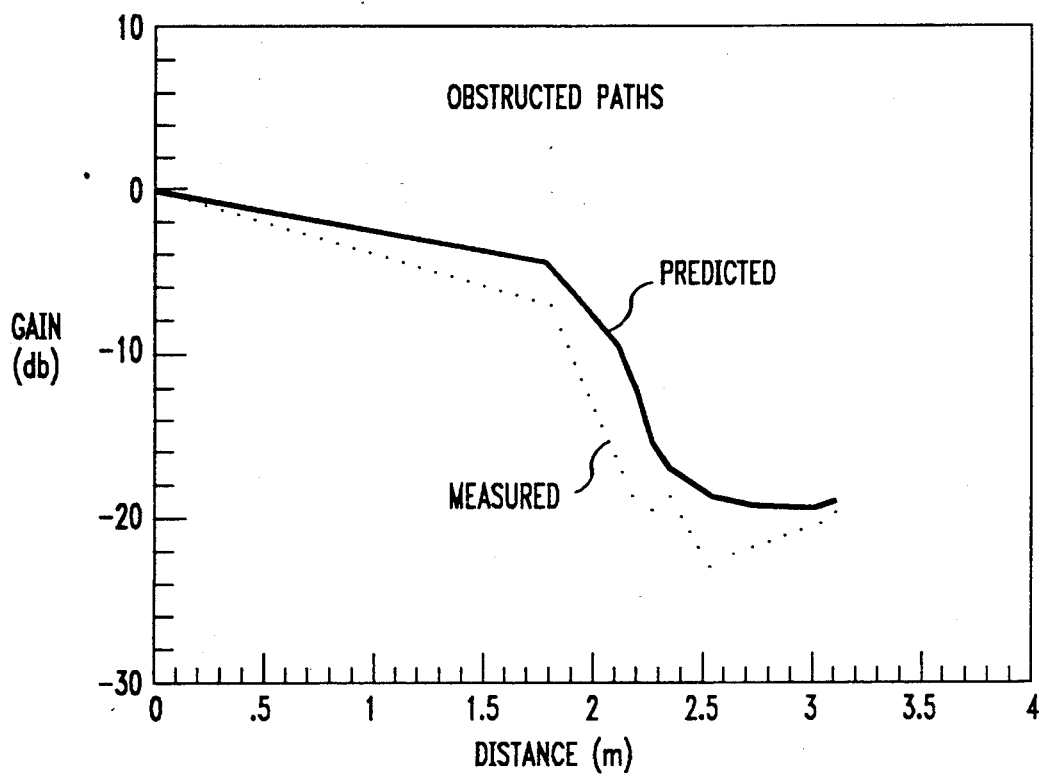
FIG. 8 is a graph showing both predicted and measured propagation loss versus distance over obstructed pathways within the same room of a building.
Figure 9:
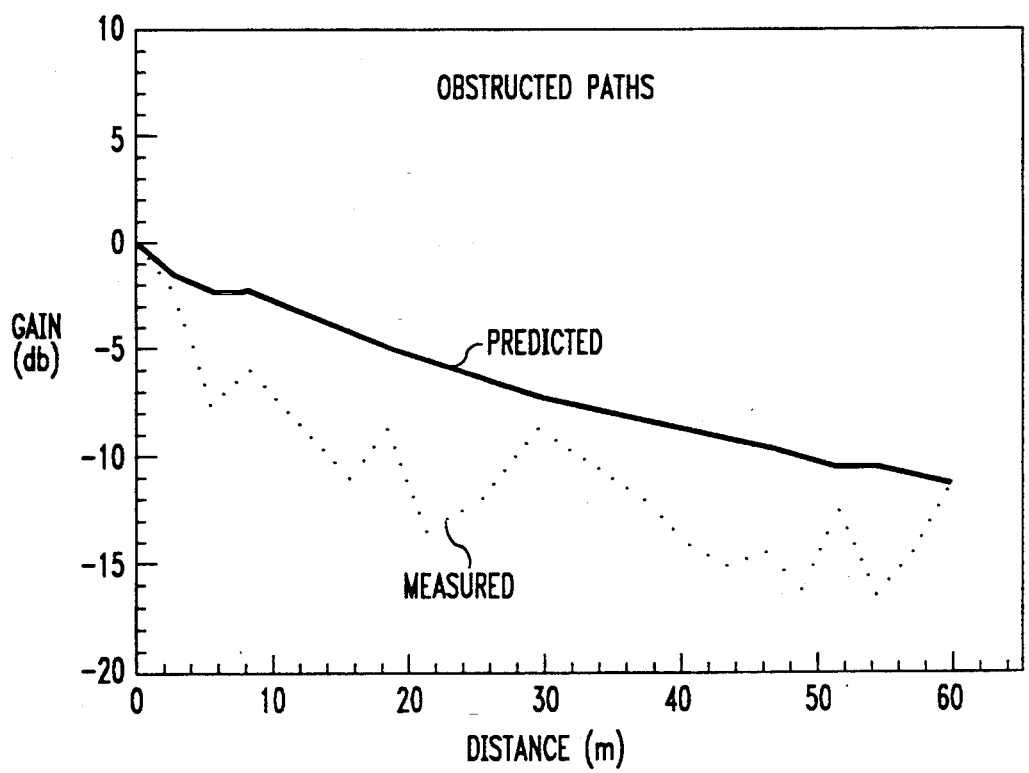
FIG. 9 is a graph showing both predicted and measured propagation loss versus distance over obstructed pathways within different rooms of a building.

With reference to FIGS. 7, 8, and 9, three categories of measurements were conducted. One category of measurement was line-of-sight, where the transmitting and receiving antennas were placed at various distances along a substantially straight, obstacle-free, central corridor of the building. The second measurement category was obstructed paths within a single room, where the receiver antenna was placed at various locations starting close to the door and moving towards the wall opposite the door. The third measurement category was obstructed paths at corresponding locations in different rooms, where the receiver antenna was successively placed in various rooms along the central corridor, such that the antenna was positioned about 2 meters from the door in each of the rooms.

FIGS. 7, 8, and 9 show the predicted values (solid line) and the measured values (dashed line) for the mean propagation loss (referenced to the loss at one meter), versus the distance between the transmitting and receiving antennas. With reference to FIGS. 7–9, it can be seen that the predicted and measured values follow the same trend. However, the predicted values consistently underestimate the measured propagation loss. This result may be explained by the fact that the recursive propagation loss model described above and in the Ramo reference assumes perfectly smooth and lossless dielectric layers at the reflection and transmission points.

In order to improve the agreement between predicted and measured values, adjustments could be made to account for scattering losses due to surface roughness. Alternatively, measurements may be carried out in an echo-free chamber to obtain experimental data for typical and/or actual building materials. These data would then be used to modify the look-up tables which would otherwise be based solely on the multilayer dielectric model.

It is to be understood that the above-described embodiments are merely illustrative principles of the invention and that many variations may be devised by those skilled in the art without departing from the scope of the invention. It is therefore intended that such variations be included within the scope of the following claims.

We claim:

1. A method for predicting RF propagation including the following steps:
   (i) selecting a reference transmitter location and at least one reference receiver location;
   (ii) determining a plurality of propagation pathways between said reference transmitter location and each of said reference receiver locations; said propagation pathways including at least one direct path joining said reference transmitter location to one of said reference receiver locations along a straight-line path, and at least one reflection path joining said reference transmitter location to one of said reference receiver locations via at least one reflective surface;
   (iii) associating each of said reflective surfaces with a reflection coefficient specifying the ratio of reflected to incident RF energy, and a transmission coefficient specifying the ratio of RF energy transmitted through the surface to incident RF energy;
   (iv) for each propagation pathway, calculating a propagation component representing propagation loss relative to free-space propagation of RF energy from a reference transmitter at the reference transmitter location producing a reference RF power level, the propagation loss being equal to the product of the magnitude squared of the reflection and transmission coefficients; and
   (v) for each reference receiver location, calculating a local mean of received power equal to the scalar sum of the powers of all of the propagation pathway components corresponding to the reference receiver location;
   (vi) calculating the propagation component of each reflection path including one reflective surface using a ray imaging procedure comprising the following steps:

(a) from the at least one reference receiver location, tracing the reflection path backwards, in a direction opposite to the direction of travel of the RF energy, to encounter a first reflective surface;

(b) determining a first reference receiver location image about the first reflective surface as the reference receiver location reflected about a plane including the first reflective surface; and (c) calculating the overall reflection path length as the distance between the reference transmitter point and the first reference receiver location image.

2. The method of claim 1 wherein the propagation component of each reflection path including n reflective surfaces, n being greater than 1, is calculated using a ray imaging procedure comprising the following steps:

(a) from the at least one reference receiver location, tracing the reflection path backwards, in a direction opposite to the direction of travel of the RF energy, to encounter an nth reflective surface;

(b) determining an nth reference receiver location image about the nth reflective surface as the reference receiver location reflected about a plan including the nth reflective surface;

(c) from the nth reflective surface, tracing the reflection path backwards to encounter an (n-1)th reflective surface;

(d) determining an (n-1)th image about the (n-1)th reflective surface as the nth reference receiver location image reflected about a plane including the (n-1)th reflective surface;

(e) repeating steps (c) and (d) recursively until the reflection path is traced back to the reference transmitter location; and (f) calculating the overall reflection path length as the distance between the reference transmitter point and the last reference receiver location image determined in step (e).

* * * * *